(12) United States Patent
Wu et al.

(10) Patent No.: US 12,144,112 B2
(45) Date of Patent: Nov. 12, 2024

(54) DISPLAY PANEL AND MANUFACTURING METHOD THEREOF

(71) Applicant: E Ink Holdings Inc., Hsinchu (TW)

(72) Inventors: Yi Jiun Wu, Hsinchu (TW);
Wen-Chung Tang, Hsinchu (TW);
Yung-Sheng Chang, Hsinchu (TW);
Cheng-Hao Lee, Hsinchu (TW);
Yu-Lin Hsu, Hsinchu (TW);
Kuo-Hsing Cheng, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 237 days.

(21) Appl. No.: 17/978,972

(22) Filed: Nov. 2, 2022

(65) Prior Publication Data
US 2023/0209709 A1 Jun. 29, 2023

(30) Foreign Application Priority Data

Dec. 24, 2021 (TW) .................................. 110148691
Oct. 11, 2022 (TW) .................................. 111138351

(51) Int. Cl.
*H05K 1/11* (2006.01)

(52) U.S. Cl.
CPC .... *H05K 1/111* (2013.01); *H05K 2201/10128* (2013.01)

(58) Field of Classification Search
CPC ...................................................... H05K 1/02
See application file for complete search history.

(56) References Cited

U.S. PATENT DOCUMENTS 9,164,342 B2  10/2015 Moriwaki
9,609,758 B2  3/2017 Jeong et al.
9,651,836 B2  5/2017 Kita et al.
10,177,172 B2  1/2019 Wu et al.
10,181,505 B2  1/2019 Han et al.
2018/0122889 A1*  5/2018 Kim ...................... G06F 3/0416
2020/0303799 A1*  9/2020 Wang .................. H05K 1/0222
2021/0183910 A1  6/2021 Zhao

FOREIGN PATENT DOCUMENTS

CN  103810981  5/2014
CN  111316443  9/2022

OTHER PUBLICATIONS

"Office Action of Taiwan Counterpart Application", issued on Nov. 16, 2023, p. 1-p. 5.

* cited by examiner

*Primary Examiner* — Jerry Wu
(74) *Attorney, Agent, or Firm* — JCIPRNET

(57) ABSTRACT

A display panel and a manufacturing method thereof are provided. The display panel includes a substrate, an active element, a driving circuit element, a first connection circuit, a second connection circuit and a conductive connector. The substrate has a first surface and a second surface opposite to the first surface. The active element is disposed on the first surface. The driving circuit element is disposed on the second surface and is overlapped with the active element. The first connection circuit is disposed on the first surface and is connected to the active element. The second connection circuit is disposed on the second surface and is connected to the driving circuit element. The conductive connector penetrates through the substrate and two ends of the conductive connector are electrically connected to the first connection circuit and the second connection circuit, respectively.

16 Claims, 16 Drawing Sheets

DISPLAY PANEL AND MANUFACTURING METHOD THEREOF

CROSS-REFERENCE TO RELATED APPLICATION

This application claims the priority benefit of Taiwan application serial no. 110148691, filed on Dec. 24, 2021 and Taiwan application serial no. 111138351, filed on Oct. 11, 2022. The entirety of each of the above-mentioned patent applications is hereby incorporated by reference herein and made a part of this specification.

BACKGROUND

Technical Field

The invention relates to a panel and a manufacturing method thereof, and particularly relates to a display panel and a manufacturing method thereof.

Description of Related Art

Along with popularization of electronic products, various display technologies are constantly improved to meet the needs of more kinds of applications. For example, display panels have been developed to have a slim bezel design to meet the needs of consumers. However, the bezel of a display panel is limited by the configuration of peripheral circuits and driving electronic elements, and it is difficult to achieve an extremely slim bezel or the bezel-less state. Generally, to achieve the slim bezel design, a line width or a line pitch of the peripheral circuit of a display area may be reduced. However, when a size of the display panel is enlarged, the thin lines may increase a resistance and capacitance load, which reduces the quality of circuit transmission.

SUMMARY

The invention is directed to a display panel with an extremely slim bezel or nearly without a bezel.

The invention is directed to a manufacturing method of a display panel, which is adapted to reduce a bezel of the display panel.

An embodiment of the invention provides a display panel including a substrate, an active element, a driving circuit element, a first connection circuit, a second connection circuit and a conductive connector. The substrate has a first surface and a second surface opposite to the first surface. The active element is disposed on the first surface. The driving circuit element is disposed on the second surface and is overlapped with the active element. The first connection circuit is disposed on the first surface and is connected to the active element. The second connection circuit is disposed on the second surface and is connected to the driving circuit element. The conductive connector penetrates through the substrate, and two ends of the conductive connector are electrically connected to the first connection circuit and the second connection circuit, respectively.

In an embodiment of the invention, a width of the conductive connector is substantially the same between the two ends, or decreased from one of the two ends to the other, or increased toward the two ends.

In an embodiment of the invention, the active elements are disposed in an array to define an active area, and the conductive connector is located in a peripheral area between the active area and at least one edge of the substrate.

In an embodiment of the invention, the first connection circuit extends from the active area to the peripheral area.

In an embodiment of the invention, the active elements are disposed in an array to define an active area, and the conductive connector is located in the active area.

In an embodiment of the invention, the first connection circuit includes a connection pad, which is disposed on the first surface and covers the conductive connector. A projection area of the connection pad on the first surface is greater than an end surface area of the conductive connector on the first surface.

In an embodiment of the invention, an end surface area of the conductive connector on the first surface is less than an end surface area of the conductive connector on the second surface.

In an embodiment of the invention, the display panel further includes a display layer, which is disposed on the first surface, and the active element is adapted to drive the display layer.

In an embodiment of the invention, a number of the conductive connectors is plural and the conductive connectors are arranged in multiple rows between an active element array formed by the active elements and one edge of the substrate.

In an embodiment of the invention, a distance between two adjacent conductive connectors is from 100 μm to 400 μm. A distance between two adjacent conductive connectors is greater than a distance between two adjacent active elements.

In an embodiment of the invention, a width of the conductive connector is from 50 μm to 200 μm.

In an embodiment of the invention, a number of the conductive connectors is plural, a number of the first connection circuits is plural, and the conductive connections connected to the two adjacent first connection circuits are located in different rows.

In an embodiment of the invention, a width of a configuration position of the conductive connector in the X direction is less than or equal to a width of an active element array formed by the active elements.

In an embodiment of the invention, a number of the conductive connectors is plural, and at least two of the conductive connectors are staggered in a direction parallel to the first connection circuit.

In an embodiment of the invention, the second connection circuit is connected between the driving circuit element and the conductive connector in a multi-line manner.

An embodiment of the invention provides a manufacturing method of a display panel including following steps. A substrate is provided. The substrate has a first surface and a second surface opposite to the first surface. A through hole penetrating through the substrate is formed. A conductive material is filled into the through hole to form a conductive connector. An active element is formed on the first surface. A first connection circuit is formed on the first surface to connect with the active element and the conductive connector. A second connection circuit is formed on the second surface to connect with the conductive connector. A driving circuit element is disposed on the second surface and connected to the second connection circuit.

In an embodiment of the invention, the above step of forming the first connection circuit on the first surface includes forming a connection pad on the first surface to cover the conductive connector. A projection area of the connection pad on the first surface is greater than a projection area of the conductive connector on the first surface.

In an embodiment of the invention, a method of forming the through hole penetrating through the substrate includes performing laser drilling from the first surface or/and the second surface.

In an embodiment of the invention, a method of filling the conductive material into the through hole includes an electroplating method or a vacuum screen printing method.

In an embodiment of the invention, a method of forming the second connection circuit on the second surface includes a gravure printing method or a reverse lithography method.

Based on the above description, in the display panel and the manufacturing method of the invention, the conductive connector penetrating through the substrate is formed, so that the driving circuit element and the active element may be respectively disposed on the opposite surfaces of the substrate, and are electrically connected to the corresponding circuit through the conductive connector, thereby reducing a space occupied by the driving circuit element in a bezel of the display panel, and achieving an extremely slim bezel or nearly no bezel effect.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
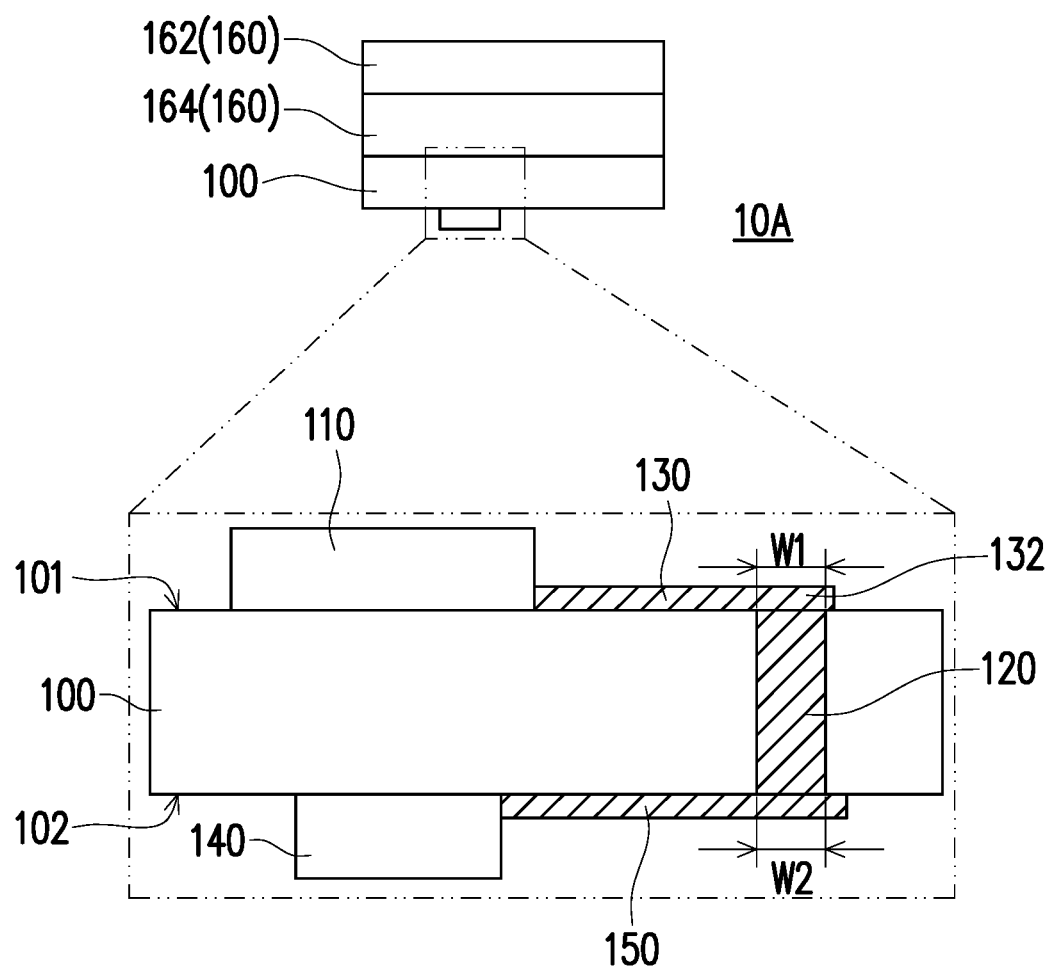
FIG. 1A is a schematic side view of a display panel according to an embodiment of the invention.

Directional terminology mentioned in the following embodiments, such as "top," "bottom," "left," "right," "front," "back," etc., is used with reference to the orientation of the FIG(s) being described and are not intended to limit the invention.

In the FIGs, each of the drawings depicts typical features of methods, structures, and/or materials used in particular exemplary embodiments. However, these drawings are not to be interpreted as limiting or limiting the scope or property covered by these exemplary embodiments. For example, for clarity's sake, relative size, thickness and position of each film layer, region and/or structure may be reduced or enlarged.

In the following embodiments, the same or similar elements are denoted by the same or similar reference numerals, and descriptions of the same technical contents are omitted. Moreover, the features in the different exemplary embodiments may be combined with each other in case of no confliction, and the simple equivalent changes and modifications made in accordance with the scope of the specification or the claims are still within the scope of the patent.

Figure 1B:
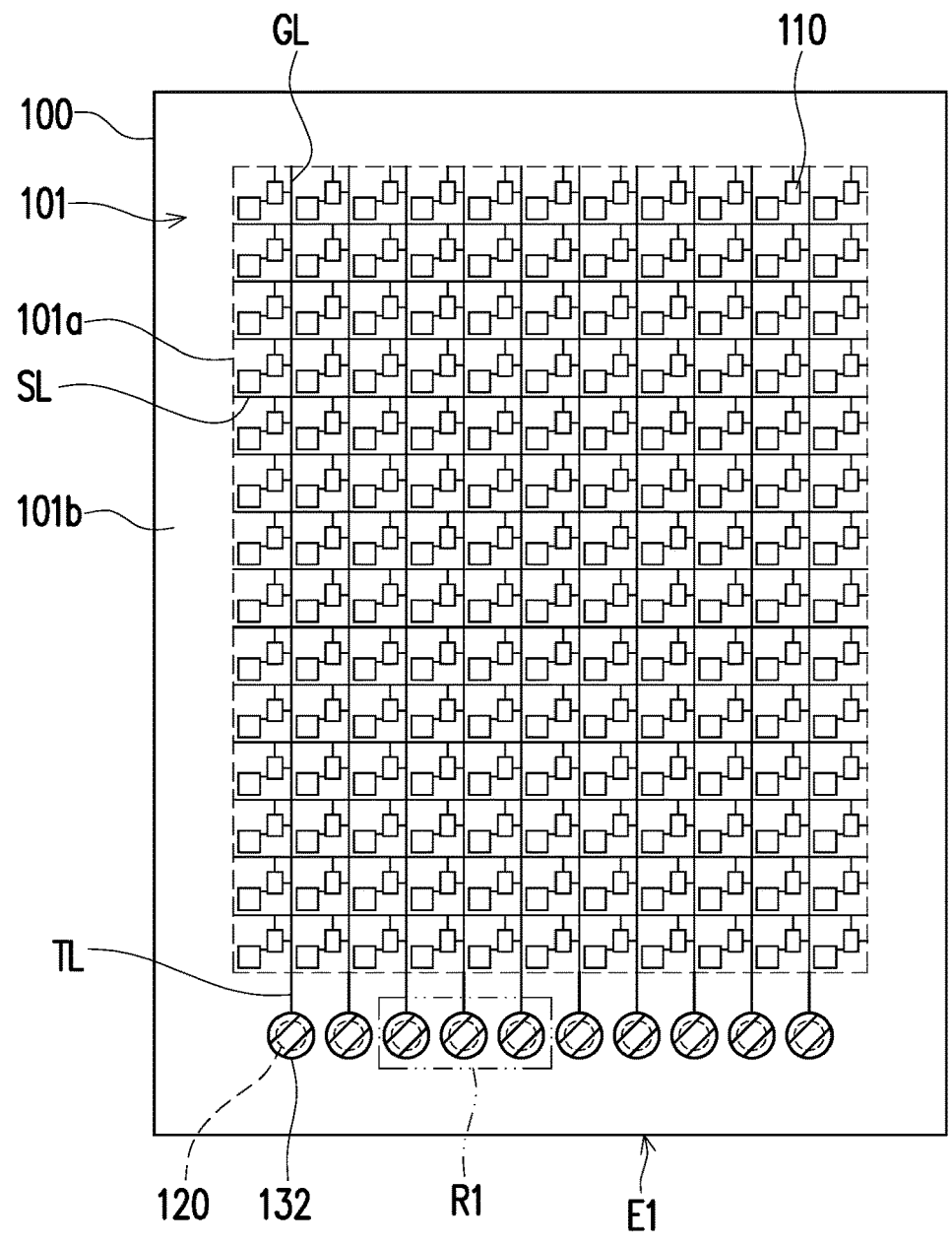
FIG. 1B is a schematic top view of the display panel of FIG. 1A.
Figure 1C:
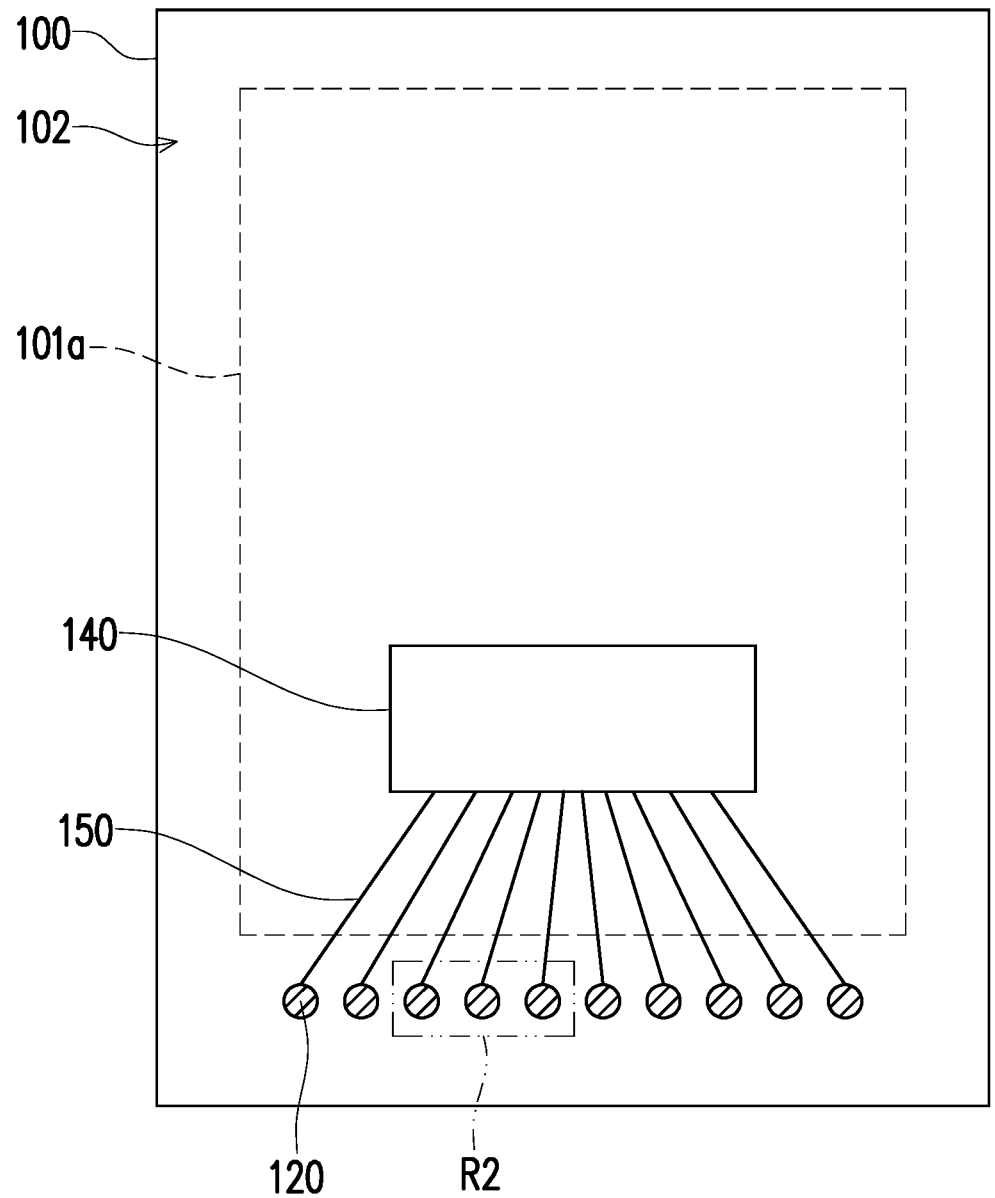
FIG. 1C is a schematic bottom view of the display panel of FIG. 1A.
Figure 1D:
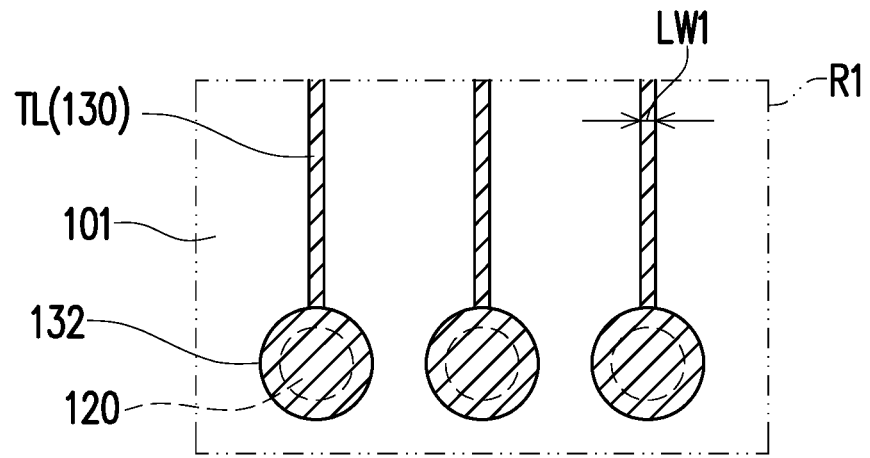
FIG. 1D is a schematic partial enlarged view of a region R1 in FIG. 1B and a region R2 in FIG. 1C.
Figure 1D:
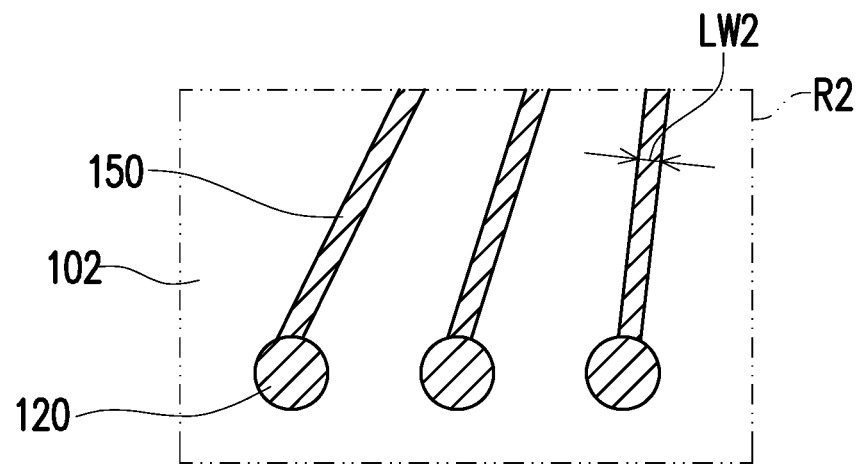

FIG. 1A is a schematic side view of a display panel according to an embodiment of the invention. FIG. 1B is a schematic top view of the display panel of FIG. 1A. FIG. 1C is a schematic bottom view of the display panel of FIG. 1A. FIG. 1D is a schematic partial enlarged view of a region R1 in FIG. 1B and a region R2 in FIG. 1C. For clarity's sake, FIG. 1B, FIG. 1C, and FIG. 1D omit illustrating parts of the elements, and the omitted parts may be understood with reference to the schematic side view of FIG. 1A.

Referring to FIG. 1A to FIG. 1D, a display panel 10A includes a substrate 100, an active element 110, a conductive connector 120, a first connection circuit 130, a driving circuit element 140 and a second connection circuit 150. The substrate 100 has a first surface 101 and a second surface 102 opposite to the first surface 101. The substrate 100 may be a flexible substrate or a non-flexible substrate, for example, a glass substrate, but the invention is not limited thereto. The active elements 110 are disposed on the first surface 101 and disposed in an array to define an active area 101a. The active element 110 includes, for example, a thin film transistor, etc., but the invention is not limited thereto. It should be understood that FIG. 1A only schematically shows the region where the active elements 110 are located, and specific details thereof may be implemented with reference to existing technologies, which is not limited by the invention. The driving circuit element 140 is disposed on the second surface 102 opposite to the active area 101a and is overlapped with the active element 110. The driving circuit element 140 may be a circuit board, an integrated circuit (IC) or a chip on film (COF), which is used for driving the active element 110. The first connection circuit 130 is disposed on the first surface 101 and is connected to the active element 110. The second connection circuit 150 is disposed on the second surface 102 and is connected to the driving circuit element 140. The conductive connector 120 penetrates through the substrate 100, and two ends of the conductive connector 120 are electrically connected to the first connection circuit 130 and the second connection circuit 150, so that the driving circuit element 140 may be electrically connected to a corresponding circuit of the active element 110 through the second connection circuit 150, the conductive connector 120 and the first connection circuit 130.

In an embodiment, the conductive connector 120 is located in a peripheral area 101b between the active area 101a and at least one edge of the substrate 100. For example, as shown in FIG. 1B, the conductive connector 120 is located in the peripheral area 101b between the active area 101a and a lower edge E1 of the substrate 100. It should be understood that FIG. 1B only schematically illustrates a row of conductive connectors 120, but it is not intended to limit the invention. In other embodiments, the conductive connectors 120 may be disposed in a plurality of rows in an interleaving manner, and a quantity or configuration of the conductive connectors 120 may be adjusted according to actual needs.

In an embodiment, a space between the conductive connectors 120 and a line distance between the first connection circuits 130 are about 1:1.

In an embodiment, the two ends of the conductive connector 120 are substantially aligned with the first surface 101 and the second surface 102, respectively.

In an embodiment, a width of the conductive connector 120 is substantially the same between the two ends (referring to FIG. 1A). For example, a shape of the conductive connector 120 is columnar, and a width W1 of the conductive connector 120 at the end close to the first surface 101 is substantially equal to a width W2 of the conductive connector 120 at the end close to the second surface 102.

In an embodiment, the width W1 of the conductive connector 120 at the end close to the first surface 101 and the width W2 of the conductive connector 120 at the end close to the second surface 102 are about 50-100 μm.

In an embodiment, the first connection circuit 130 extends from the active area 101a to the peripheral area 101b. For example, the first connection circuit 130 includes a source line SL and a gate line GL located in the active area 101a, and a trace TL located in the peripheral area 101b. The source line SL and the gate line GL intersect each other and are electrically connected to the active element 110. The trace TL extends from the source line SL or the gate line GL to the peripheral area 101b and is electrically connected to the conductive connector 120.

In an embodiment, the first connection circuit 130 further includes a connection pad 132. For example, as shown in FIG. 1D, the connection pad 132 is disposed on the first surface 101, and is located at an end of the trace TL of the first connection circuit 130, and covers one end of the conductive connector 120. The other end of the conductive connector 120 is exposed to the second surface 102. A projection area of the connection pad 132 on the first surface 101 is larger than an end surface area of the conductive connector 120 on the first surface 101, so as to facilitate the electrical connection between the first connection circuit 130 and the conductive connector 120. In other embodiments, an end of the second connection circuit 150 may also include a connection pad (not shown) disposed on the second surface 102 and covering the conductive connector 120, which is not limited by the invention.

In an embodiment, a line width LW2 of the second connection circuit 150 may be greater than a line width LW1 of the first connection circuit 130. For example, the line width LW2 of the second connection circuit 150 is about 20 μm, and the line width LW1 of the first connection circuit 130 is about 10 μm.

In an embodiment, a shape of the connection pad 132 may be a circle, an ellipse, a rectangle or other suitable shapes, which is not limited by the invention.

In an embodiment, the display panel 10A further includes a display layer 160 disposed on the first surface 101, and the active element 110 is adapted to drive the display layer 160. The display layer 160 may be a self-luminous display layer, a reflective display layer or other suitable display layers, which is not limited by the invention. The display layer 160 includes, for example, a substrate 162 and a display material layer 164, and the display material layer 164 is located between the substrate 162 and the substrate 100. The substrate 162 is, for example, a glass substrate or other suitable substrates, which is not limited by the invention. A material of the display material layer 164 may be a suitable material such as a liquid crystal material, an organic light-emitting material, an inorganic light-emitting material, etc., which is not limited by the invention.

Since the display panel 10A includes the conductive connector 120, the driving circuit element 140 may be disposed on the second surface 102, so as to reduce occupying the space of the peripheral area 101b of the first surface 101, and reduce a circuit layout of the first connection circuit 130 on the peripheral area 101b, and disperse the same to the second surface 102 to achieve the extremely slim bezel of the display panel 10A.

Figure 2:
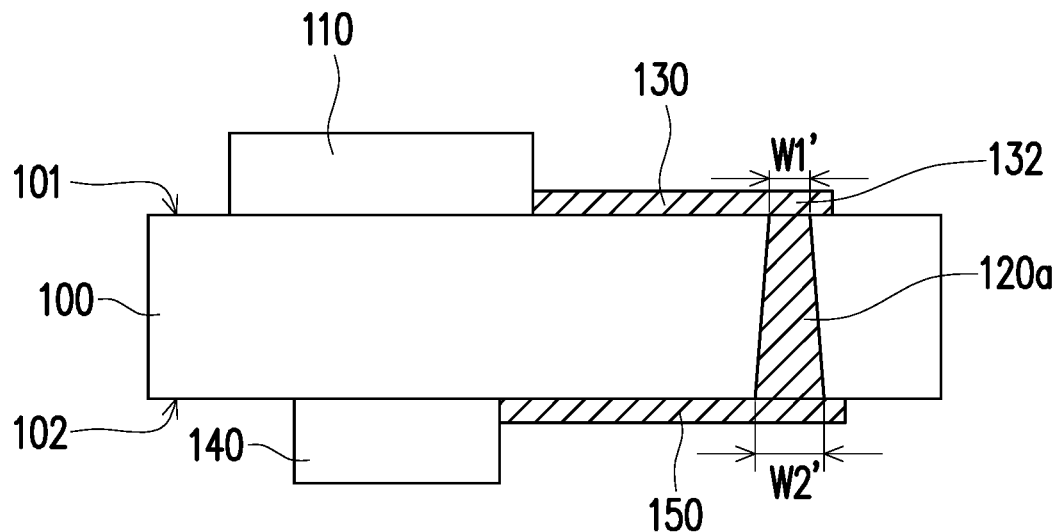
FIG. 2 is a schematic partial side view of a display panel according to another embodiment of the invention.

FIG. 2 is a schematic side view of a display panel according to another embodiment of the invention. The schematic cross-sectional view of FIG. 2 is roughly similar to the schematic side view of FIG. 1A, so that the aforementioned content may be referred for the same elements described in the two embodiments, and the same configuration in the two embodiments will not be repeated here. In order to clearly illustrate the structure of the substrate 100, FIG. 2 only illustrates a partial schematic side view of the substrate 100, and the display layer 160 is omitted. A top view and a bottom view of the embodiment may be learned with reference to the top view (for example, FIG. 1B) and bottom view (for example, FIG. 1C) of other embodiments. Referring to FIG. 2, a display panel 10B includes a substrate 100, an active element 110, a conductive connector 120a, a first connection circuit 130, a driving circuit element 140 and a second connection circuit 150. The substrate 100 has a first surface 101 and a second surface 102 opposite to the first surface 101. The active element 110 is disposed on the first surface 101. The driving circuit element 140 is disposed on the second surface 102 opposite to the active area 101a and is overlapped with the active element 110. The first connection circuit 130 is disposed on the first surface 101 and is connected to the active element 110. The second connection circuit 150 is disposed on the second surface 102 and is connected to the driving circuit element 140. The conductive connector 120a penetrates through the substrate 100, and two ends of the conductive connector 120a are electrically connected to the first connection circuit 130 and the second connection circuit 150 respectively, so that the driving circuit element 140 may be electrically connected to the corresponding circuit of the active element 110 through the first connection circuit 130, the conductive connector 120a, and the second connection circuit 150.

A difference between the display panel 10B of the embodiment and the embodiment of FIG. 1A is that a width of the conductive connector 120a of the display panel 10B is decreased from one of the two ends to the other. For example, a shape of the conductive connector 120a is a cone shape, and the width thereof is decreased from one end close to the second surface 102 to the other end close to the first surface 101. Namely, an end surface area of the conductive connector 120a on the first surface 101 is less than an end surface area of the conductive connector 120a on the second surface 102. In this way, since the end surface area of the conductive connector 120a on the first surface 101 is relatively small, it avails the layout and connection of the first connection circuit 130, thereby achieving the extremely slim bezel of the display panel 10B.

In an embodiment, a width W1' of one end of the conductive connector 120a close to the first surface 101 is about 50% of a width W2' of the other end of the conductive connector 120a close to the second surface 102.

Figure 3:
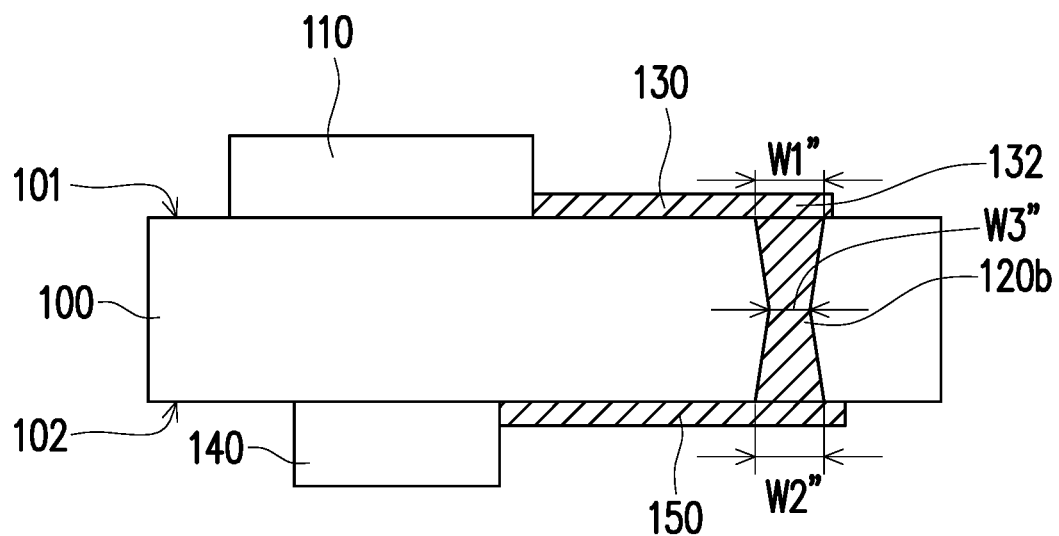
FIG. 3 is a schematic partial side view of a display panel according to another embodiment of the invention.

FIG. 3 is a schematic side view of a display panel according to another embodiment of the invention. The schematic cross-sectional view of FIG. 3 is roughly similar to the schematic side view of FIG. 1A, so that the aforementioned content may be referred for the same elements described in the two embodiments, and the same configuration in the two embodiments will not be repeated here. In order to clearly illustrate the structure of the substrate 100, FIG. 3 only illustrates a partial schematic side view of the substrate 100, and the display layer 160 is omitted. A top view and a bottom view of the embodiment may be learned with reference to the top view (for example, FIG. 1B) and bottom view (for example, FIG. 1C) of other embodiments.

Referring to FIG. 3, a display panel 10C includes a substrate 100, an active element 110, a conductive connector 120b, a first connection circuit 130, a driving circuit element 140 and a second connection circuit 150. The substrate 100 has a first surface 101 and a second surface 102 opposite to the first surface 101. The active element 110 is disposed on the first surface 101. The driving circuit element 140 is disposed on the second surface 102 opposite to the active area 101a and is overlapped with the active element 110. The first connection circuit 130 is disposed on the first surface 101 and is connected to the active element 110. The second connection circuit 150 is disposed on the second surface 102 and is connected to the driving circuit element 140. The conductive connector 120b penetrates through the substrate 100, and two ends of the conductive connector 120b are electrically connected to the first connection circuit 130 and the second connection circuit 150 respectively, so that the driving circuit element 140 may be electrically connected to the corresponding circuit of the active element 110 through the first connection circuit 130, the conductive connector 120b, and the second connection circuit 150.

A difference between the display panel 10C of the embodiment and the embodiment of FIG. 1A is that a width of the conductive connector 120b of the display panel 10C is increased toward the two ends. For example, a shape of the conductive connector 120b is a sandglass shape, and a width thereof is the smallest in the middle, and is increased toward both ends.

In an embodiment, the minimum width W3" of the conductive connector 120b is approximately 60% to 70% of a width W1" of the end close to the first surface 101, or 60% to 70% of a width W2" of the end close to the second surface 102.

Figure 4:
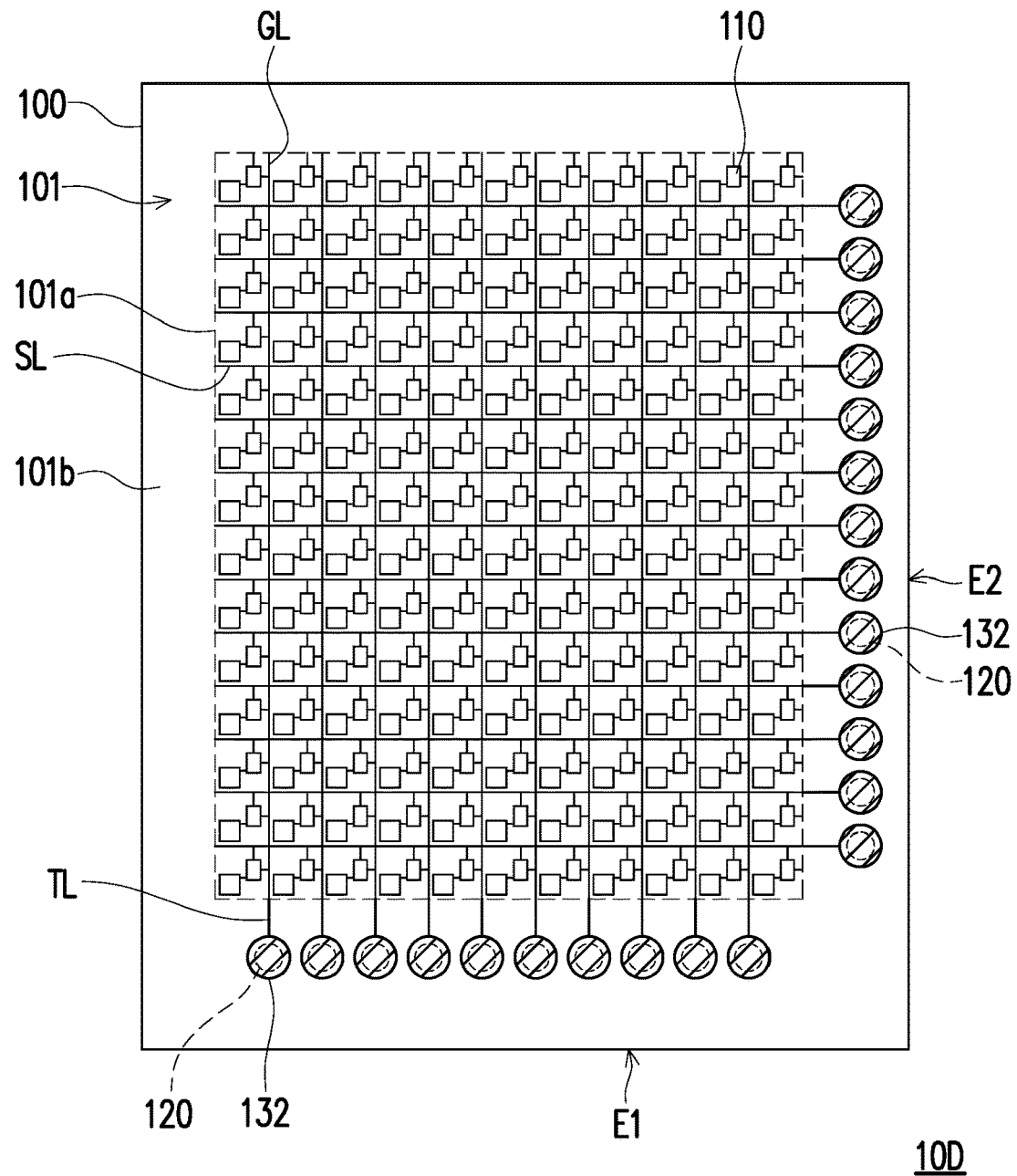
FIG. 4 is a schematic top view of a display panel according to another embodiment of the invention.

FIG. 4 is a schematic top view of a display panel according to another embodiment of the invention. The schematic top view of FIG. 4 is roughly similar to the schematic top view of FIG. 1B, so that the aforementioned content may be referred for the same elements described in the two embodiments, and the same configuration in the two embodiments will not be repeated here. A top and bottom enlarged views of the connection pad 132 of FIG. 4 may refer to FIG. 1D, which are similar to the partial enlarged views of FIG. 1D. A schematic side view of the embodiment may be learned with reference to the schematic side view of other embodiments (for example, FIG. 1A, FIG. 2 or FIG. 3).

Referring to FIG. 4, a display panel 10D includes a substrate 100, an active element 110, a conductive connector 120 (refer to FIG. 1D), a first connection circuit 130, a driving circuit element 140, and a second connection circuit 150. The substrate 100 has a first surface 101 and a second surface 102 opposite to the first surface 101. The active element 110 is disposed on the first surface 101. The driving circuit element 140 is disposed on the second surface 102 opposite to the active area 101a and is overlapped with the active element 110. The first connection circuit 130 is disposed on the first surface 101 and is connected to the active element 110. An end of the first connection circuit 130 includes a connection pad 132 which covers one end of the conductive connector 120. The second connection circuit 150 is disposed on the second surface 102 and is connected to the driving circuit element 140. The conductive connector 120 penetrates through the substrate 100, and two ends of the conductive connector 120 are respectively electrically connected to the first connection circuit 130 and the second connection circuit 150, so that the driving circuit element 140 may be electrically connected to the corresponding circuit of the active element 110 through the first connection circuit 130, the conductive connector 120, and the second connection circuit 150.

A difference between the display panel 10D of the embodiment and the embodiment of FIG. 1B is that the conductive connectors 120 of the display panel 10D are located in the peripheral area 101b between the active area 101a and a right edge E2 and a lower edge E1 of the substrate 100, so as to achieve the extremely slim bezel of the display panel 10D while providing a flexible circuit layout between the active element 110 and the driving circuit element 140.

Figure 5:
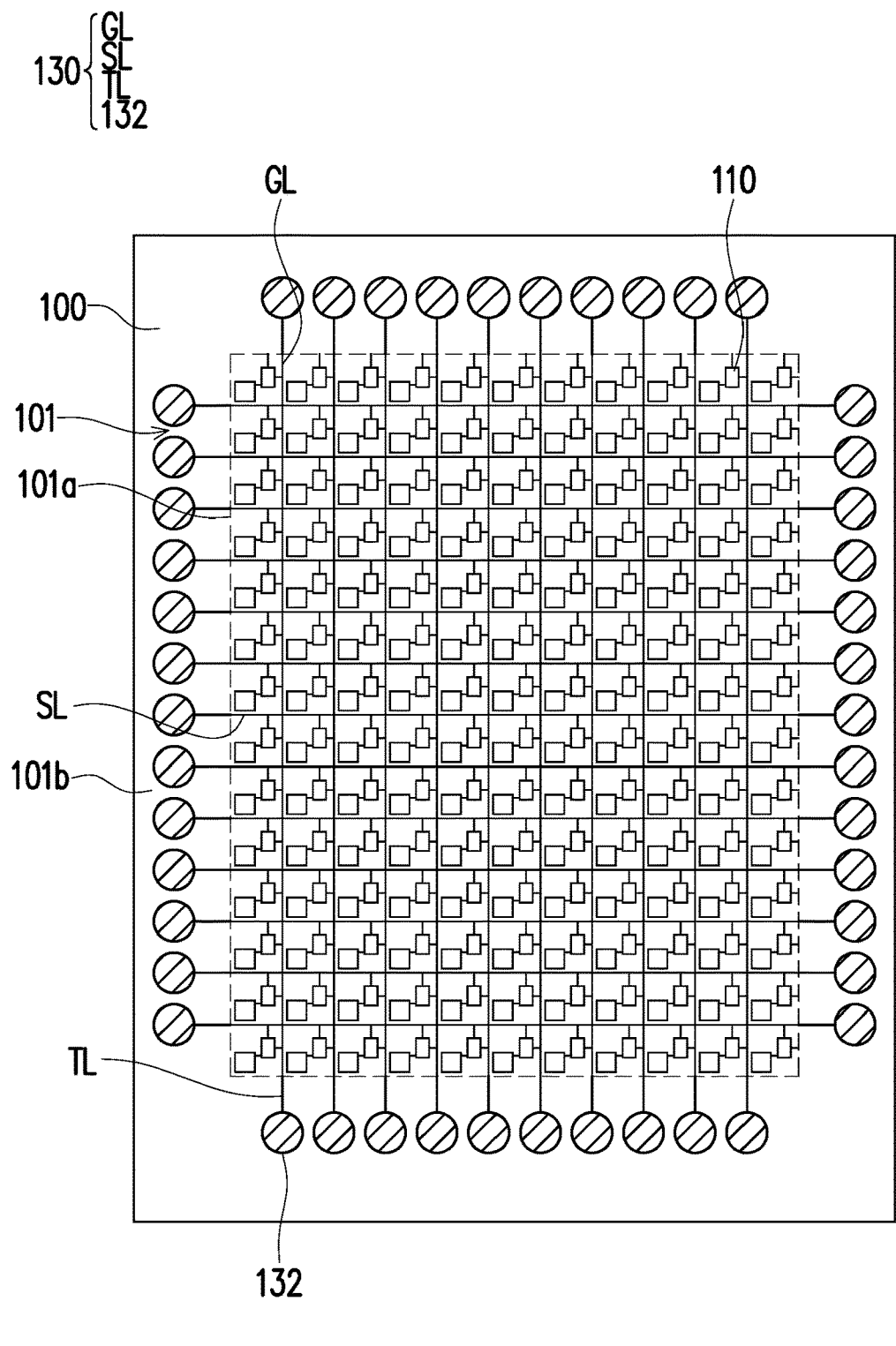
FIG. 5 is a schematic top view of a display panel according to another embodiment of the invention.

FIG. 5 is a schematic top view of a display panel according to another embodiment of the invention. The schematic top view of FIG. 5 is roughly similar to the schematic top view of FIG. 1B, so that the aforementioned content may be referred for the same elements described in the two embodiments, and the same configuration in the two embodiments will not be repeated here. A top and bottom enlarged views of the connection pad 132 of FIG. 5 may refer to FIG. 1D, which are similar to the partial enlarged views of FIG. 1D. A schematic side view of the embodiment may be learned with reference to the schematic side view of other embodiments (for example, FIG. 1A, FIG. 2 or FIG. 3).

Referring to FIG. 5, a display panel 10E includes a substrate 100, an active element 110, a conductive connector 120 (refer to FIG. 1D), a first connection circuit 130, a driving circuit element 140, and a second connection circuit 150. The substrate 100 has a first surface 101 and a second surface 102 opposite to the first surface 101. The active element 110 is disposed on the first surface 101. The driving circuit element 140 is disposed on the second surface 102 opposite to the active area 101a and is overlapped with the active element 110. The first connection circuit 130 is disposed on the first surface 101 and is connected to the active element 110. An end of the first connection circuit 130 includes a connection pad 132 which covers one end of the conductive connector 120. The second connection circuit 150 is disposed on the second surface 102 and is connected to the driving circuit element 140. The conductive connector 120 penetrates through the substrate 100, and two ends of the conductive connector 120 are respectively electrically connected to the first connection circuit 130 and the second connection circuit 150, so that the driving circuit element 140 may be electrically connected to the corresponding circuit of the active element 110 through the first connection circuit 130, the conductive connector 120, and the second connection circuit 150.

A difference between the display panel 10E of the embodiment and the embodiment of FIG. 1B is that the conductive connectors 120 of the display panel 10E are located in the peripheral area 101b between the active area 101a and four edges of the substrate 100, i.e., the conductive connectors 120 are disposed around the active area 101a. In this way, the extremely slim bezel of the display panel 10D may be achieved while providing a flexible circuit layout between the active element 110 and the driving circuit element 140.

Figure 6A:
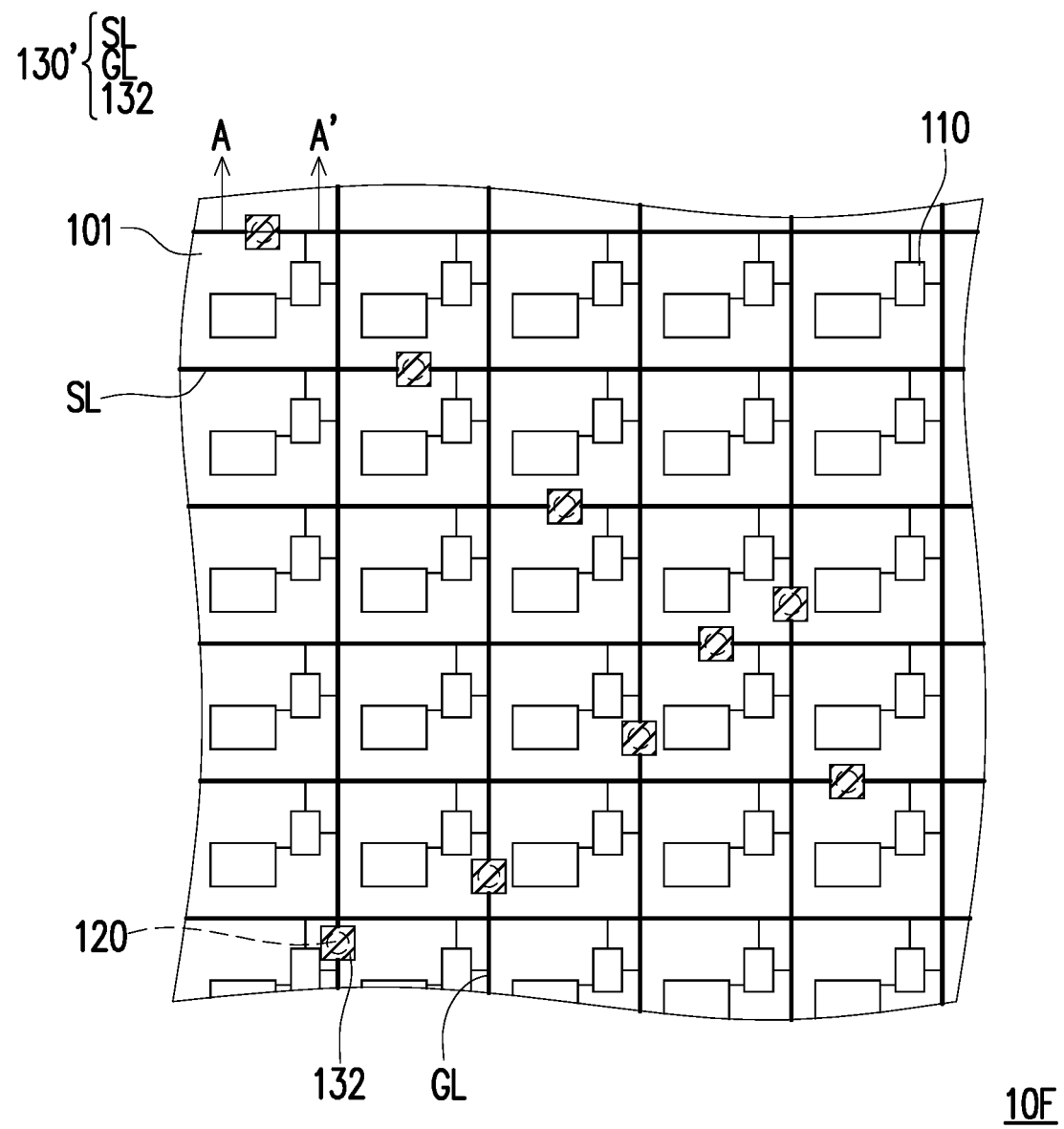
FIG. 6A is a schematic partial enlarged top view of a display panel according to another embodiment of the invention.

FIG. 6A is a schematic partial enlarged top view of a display panel according to another embodiment of the invention. FIG. 6A is only a schematic partial enlarged top view of an active area of the display panel, and the schematic top view of FIG. 6A is roughly similar to the schematic top view of FIG. 1B, so that the aforementioned content may be referred for the same elements described in the two embodiments, and the same configuration in the two embodiments will not be repeated here. A schematic side view of the embodiment may be learned with reference to the schematic side view of other embodiments (for example, FIG. 1A, FIG. 2 or FIG. 3).

Referring to FIG. 6A, a display panel 10F includes a substrate 100, an active element 110, a conductive connector 120a, a first connection circuit 130', a driving circuit element 140, and a second connection circuit 150. The substrate 100 has a first surface 101 and a second surface 102 opposite to the first surface 101. The active element 110 is disposed on the first surface 101. The driving circuit element 140 is disposed on the second surface 102 opposite to the active area 101a and is overlapped with the active element 110. The first connection circuit 130' is disposed on the first surface 101 and is connected to the active element 110. The second connection circuit 150 is disposed on the second surface 102 and is connected to the driving circuit element 140. The conductive connector 120a penetrates through the substrate 100, and two ends of the conductive connector 120a are respectively electrically connected to the first connection circuit 130' and the second connection circuit 150, so that the driving circuit element 140 may be electrically connected to the corresponding circuit of the active element 110 through the first connection circuit 130', the conductive connector 120a, and the second connection circuit 150.

A difference between the display panel 10F of the embodiment and the embodiment of FIG. 1B is that the conductive connector 120 of the display panel 10F is located in the active area 101a, and the first connection circuit 130' includes a source line SL, a gate line GL and a connection pad 132 located in the active area 101a. Since the conductive connector 120 is located in the active area 101a, the wiring located in the peripheral area 101b may be omitted, so that the corresponding circuit of the active element 110 does not need to be fanned out to the peripheral area 101b, but may be connected to the corresponding circuit of the driving circuit element 140 located on the second surface 102 through the conductive connector 120. In this way, the display panel 10F may be a display panel with an extremely slim bezel or nearly without a bezel.

Figure 6B:
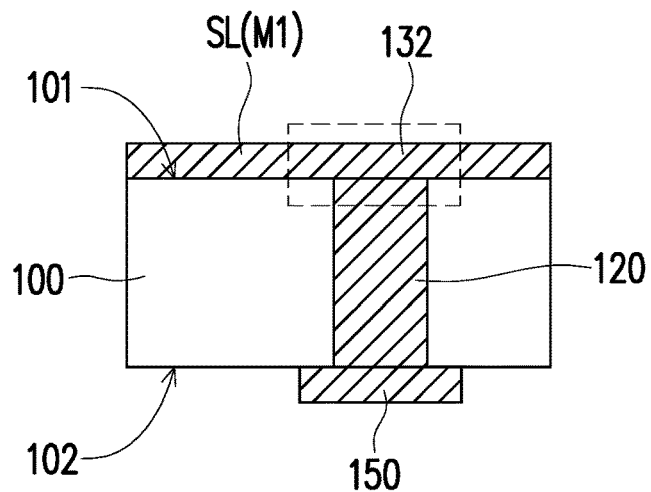
FIG. 6B is a schematic cross-sectional view of an implementation of the display panel of FIG. 6A along a section line A-A'.
Figure 6C:
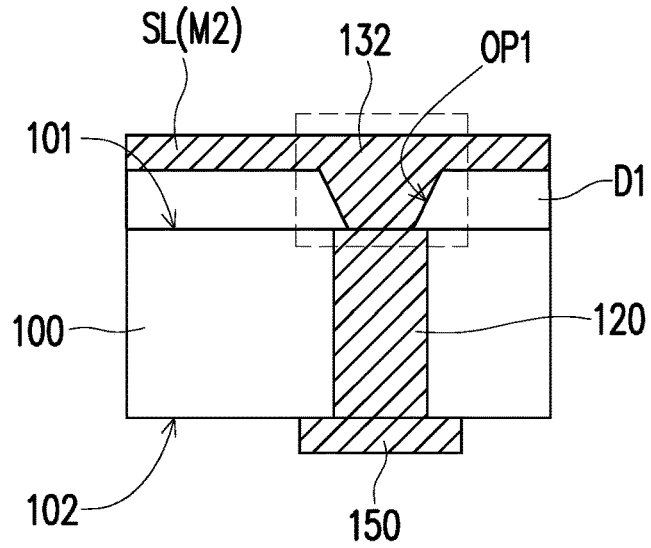
FIG. 6C is a schematic cross-sectional view of another implementation of the display panel of FIG. 6A along the section line A-A'.
Figure 6D:
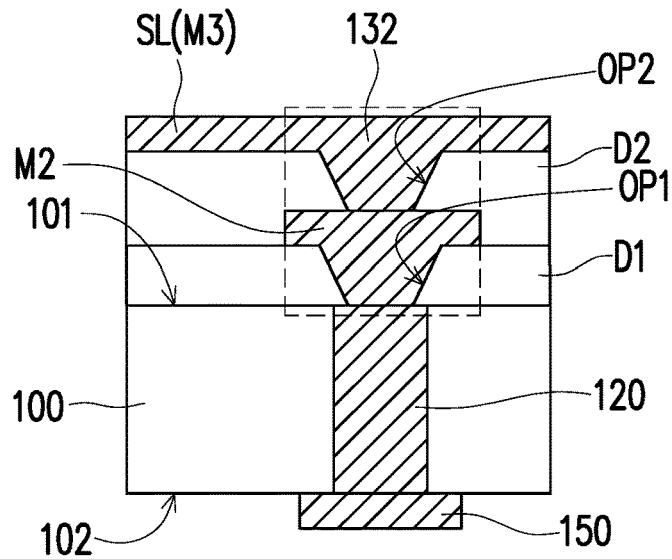
FIG. 6D is a schematic cross-sectional view of still another implementation of the display panel of FIG. 6A along the section line A-A'.

FIG. 6B is a schematic cross-sectional view of an implementation of the display panel of FIG. 6A along a section line A-A'. FIG. 6C is a schematic cross-sectional view of another implementation of the display panel of FIG. 6A along the section line A-A'. FIG. 6D is a schematic cross-sectional view of still another implementation of the display panel of FIG. 6A along the section line A-A'. FIG. 6B to FIG. 6D schematically illustrate some connection methods of the conductive connector 120 and the first connection circuit 130', which take the connection of the conductive connector 120 and the source line SL as an example for description, but it should be understood that similar structures may also be applied to the connection between the conductive connector 120 and the gate line GL.

Referring to FIG. 6B to FIG. 6D, the first connection circuit 130' may be composed of a first metal layer M1, a second metal layer M2, and/or a third metal layer M3. For example, in FIG. 6B, the first metal layer M1 is disposed on the first surface 101 of the substrate 100, which may form the source line SL and the connection pad 132, and is electrically connected to the conductive connector 120. The first metal layer M1 may form the source line SL and the connection pad 132 of the first connection circuit 130, i.e., the source line SL and the connection pad 132 may be formed in a same manufacturing process.

In FIG. 6C, a first dielectric layer D1 may be disposed on the first surface 101 of the substrate 100, where the first dielectric layer D1 has an opening OP1 exposing a top end of the conductive connector 120. The second metal layer M2 is disposed on the first dielectric layer D1 and filled in the opening OP1, so that the second metal layer M2 is electrically connected to the conductive connector 120. The second metal layer M2 may form the source line SL and the connection pad 132 of the first connection circuit 130, i.e., the source line SL and the connection pad 132 may be formed in the same manufacturing process.

In FIG. 6D, the first dielectric layer D1 may be disposed on the first surface 101 of the substrate 100, where the first dielectric layer D1 has the opening OP1 exposing the top end of the conductive connector 120. The second metal layer M2 is disposed on the first dielectric layer D1 and filled in the opening OP1, so that the second metal layer M2 is electrically connected to the conductive connector 120. A second dielectric layer D2 is disposed on the first dielectric layer D1 and the second metal layer M2, where the second dielectric layer D2 has an opening OP2 exposing a part of a top surface of the second metal layer M2. The third metal layer M3 is disposed on the second dielectric layer D2 and filled in the opening OP2, so that the third metal layer M3 is electrically connected to the conductive connector 120 through the second metal layer M2. In the embodiment, the source line SL may be formed by the third metal layer M3, and the connection pad 132 may be formed by the second metal layer M2 and the third metal layer M3. In an embodiment, the second metal layer M2 may be of a same film layer as the gate line GL, but the invention is not limited thereto.

FIG. 7A to FIG. 7F are schematic diagrams of a manufacturing process of a display panel according to another embodiment of the invention.

Figure 7A:
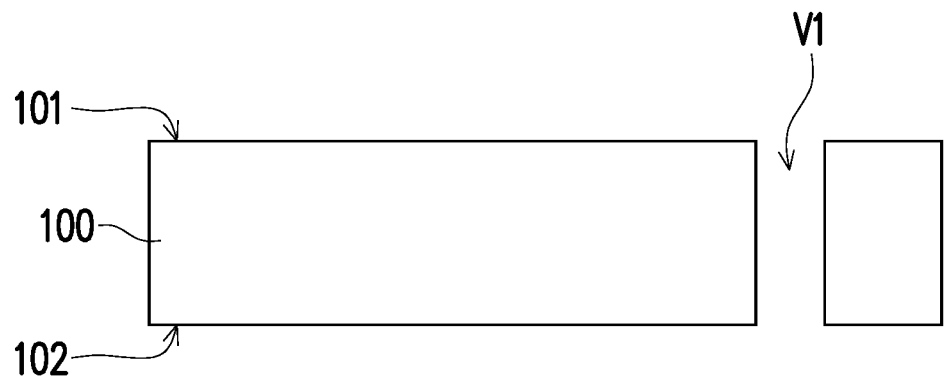
FIG. 7A to FIG. 7F are schematic diagrams of a manufacturing process of a display panel according to another embodiment of the invention.

Referring to FIG. 7A, the substrate 100 is provided. The substrate 100 has the first surface 101 and the second surface 102 opposite to the first surface 101. The substrate 100 may be a flexible substrate or a non-flexible substrate, for example, a glass substrate, but the invention is not limited thereto.

Continuing to refer to FIG. 7A, a through hole V1 penetrating through the substrate 100 is formed. For example, laser drilling may be performed from the first surface 101 or the second surface 102 to form a columnar or cone-shaped through hole V1. In other embodiments, laser drilling may be performed from the first surface 101 and the second surface 102 to form a sandglass-shaped through hole V1.

In an embodiment, the aperture of the through hole V1 on the first surface 101 or the second surface 102 is about 50-100 μm.

Figure 7B:
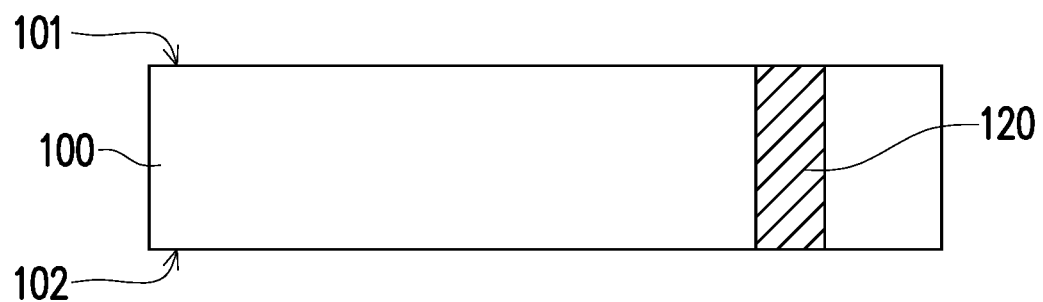

Referring to FIG. 7B, a conductive material is filled into the through hole V1 to form the conductive connector 120. For example, an electroplating method may be used to plate a conductive material (such as copper) on the surface of the substrate 100 and in the through hole V1, and then remove the copper on the surface of the substrate 100 to form the conductive connector 120. In other embodiments, a vacuum screen printing method may be used to dispose a conductive material (such as silver paste) on the through hole V1, and the conductive material is filled into the through hole V1 by vacuum to form the conductive connector 120. As a result, the conductive material may be effectively used to avoid unnecessary waste, and the manufacturing process may be simplified.

Figure 7C:
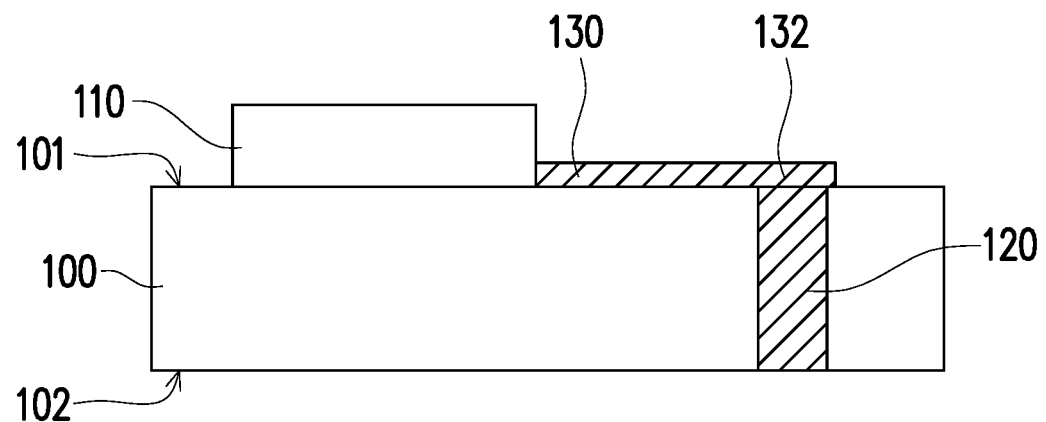

Referring to FIG. 7C, the active element 110 is formed on the first surface 101, and the first connection circuit 130 is formed on the first surface 101 to connect with the active element 110 and the conductive connector 120. A method of forming the active element 110 and the first connection circuit 130 is, for example, a photolithography process, and the active element 110 and the first connection circuit 130 may be formed under the same process. It should be understood that FIG. 7C only schematically shows the area where the active element 110 is located, and specific details thereof may be implemented with reference to the existing technology, which is not limited by the invention.

In an embodiment, the step of forming the first connection circuit 130 on the first surface 101 includes forming the connection pad 132 on the first surface 101 and covering the conductive connector 120. A projection area of the connection pad 132 on the first surface 101 is larger than an end surface area of the conductive connector 120 on the first surface 101.

Figure 7D:
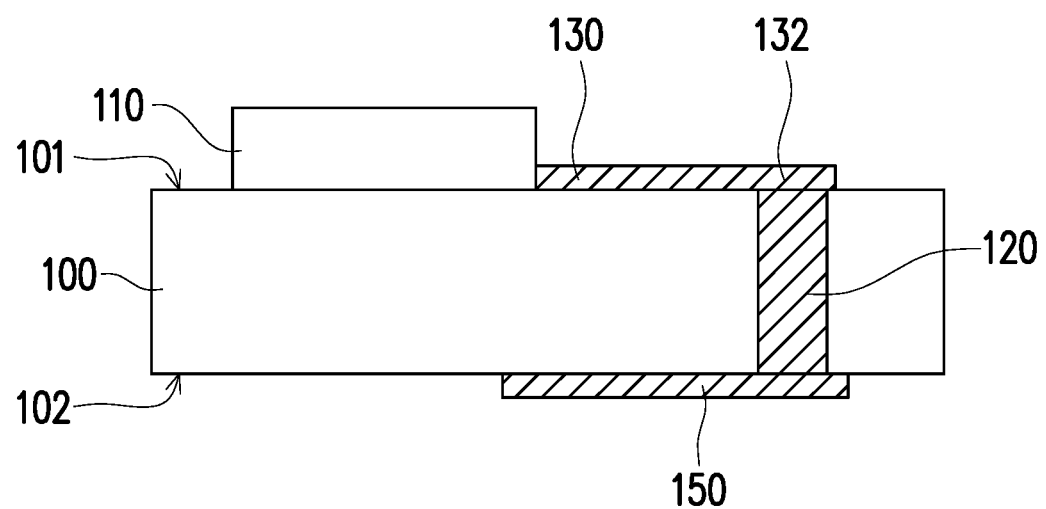

Referring to FIG. 7D, the second connection circuit 150 is formed on the second surface 102 to connect with the conductive connector 120. For example, a method of forming the second connection circuit 150 may include a gravure printing method or a reverse lithography method, which may simplify the manufacturing process and reduce damage to the circuit structure on the first surface 101 during formation of the second connection circuit 150.

Figure 7E:
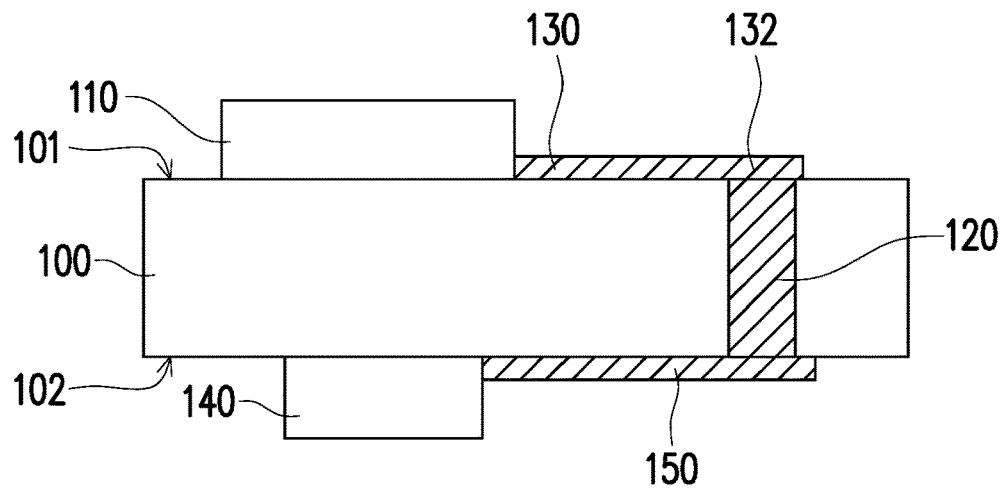

Referring to FIG. 7E, the driving circuit element 140 is disposed on the second surface 102 and is connected to the second connection circuit 150. The driving circuit element 140 may be a circuit board, an integrated circuit (IC) or a chip on film (COF) configured to drive the active element 110. It should be understood that FIG. 7E only schematically shows the area where the driving circuit element 140 is located, and specific details thereof may be implemented with reference to the existing technology, which is not limited by the invention.

Figure 7F:
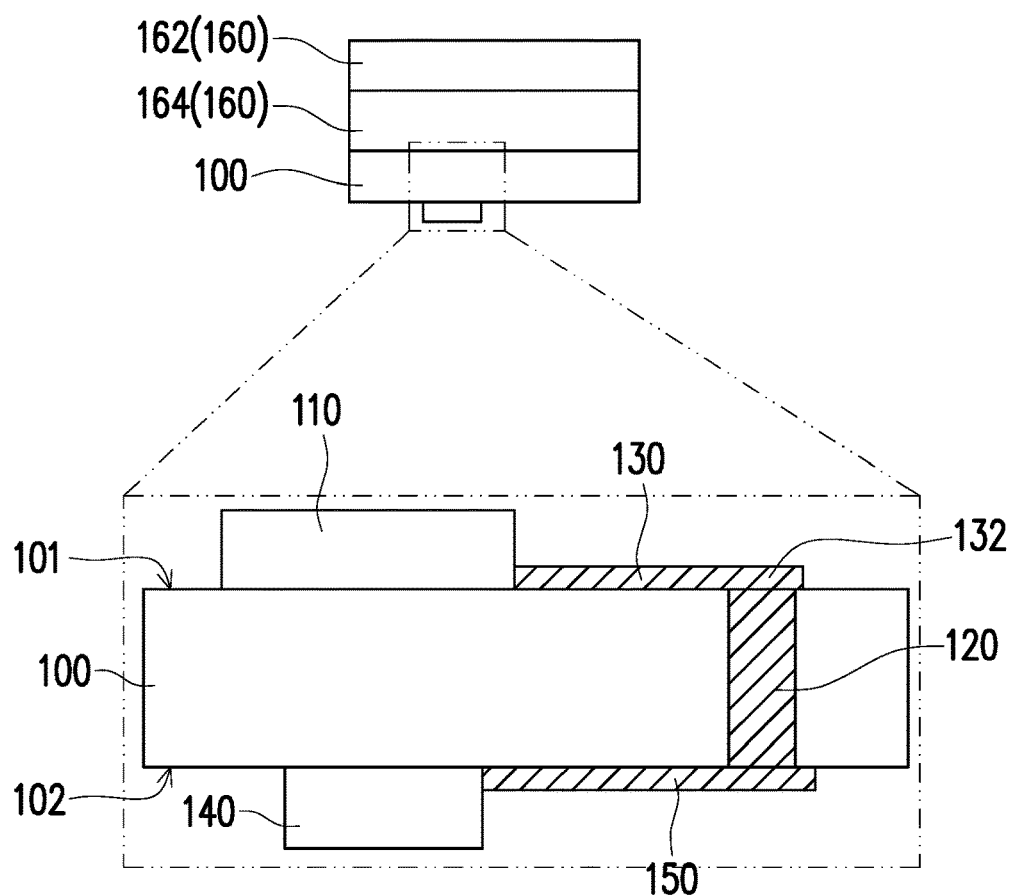

Referring to FIG. 7F, the display layer 160 is disposed on the first surface 101, and the active element 110 is adapted to drive the display layer 160. The display layer 160 may be a self-luminous display layer, a reflective display layer or other suitable display layers, which is not limited by the invention. The display layer 160 includes, for example, the substrate 162 and the display material layer 164, and the display material layer 164 is located between the substrate 162 and the substrate 100. The substrate 162 is, for example, a glass substrate or other suitable substrates, which is not limited by the invention. A material of the display material layer 164 may be a suitable material such as a liquid crystal material, an organic light-emitting material, an inorganic light-emitting material, etc., which is not limited by the invention. It should be understood that FIG. 7F only schematically shows the area where the display layer 160 is located, and specific details thereof may be implemented with reference to the existing technology, which is not limited by the invention.

Figure 8:
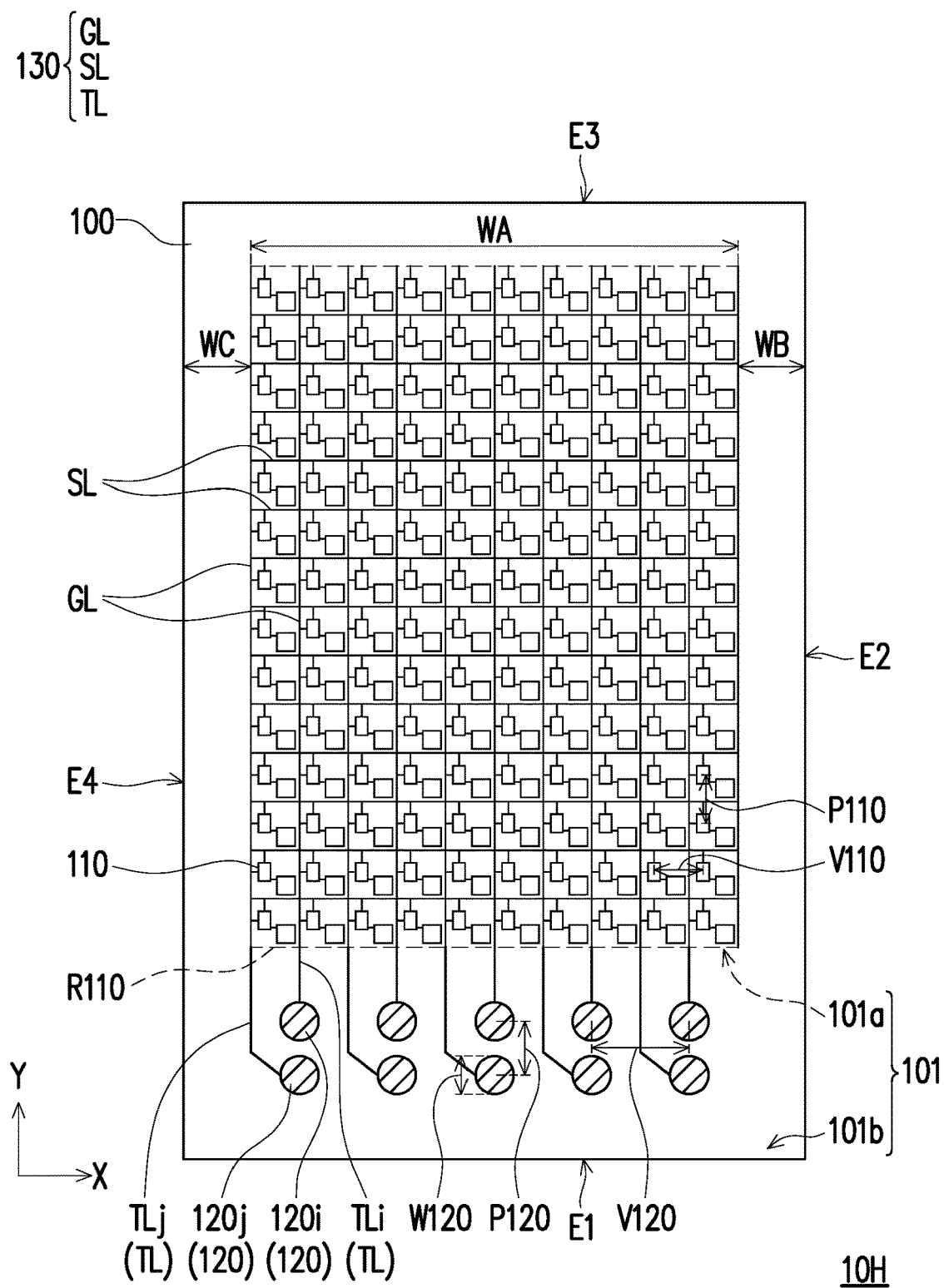
FIG. 8 is a schematic top view of a display panel according to an embodiment of the invention.
Figure 9A:
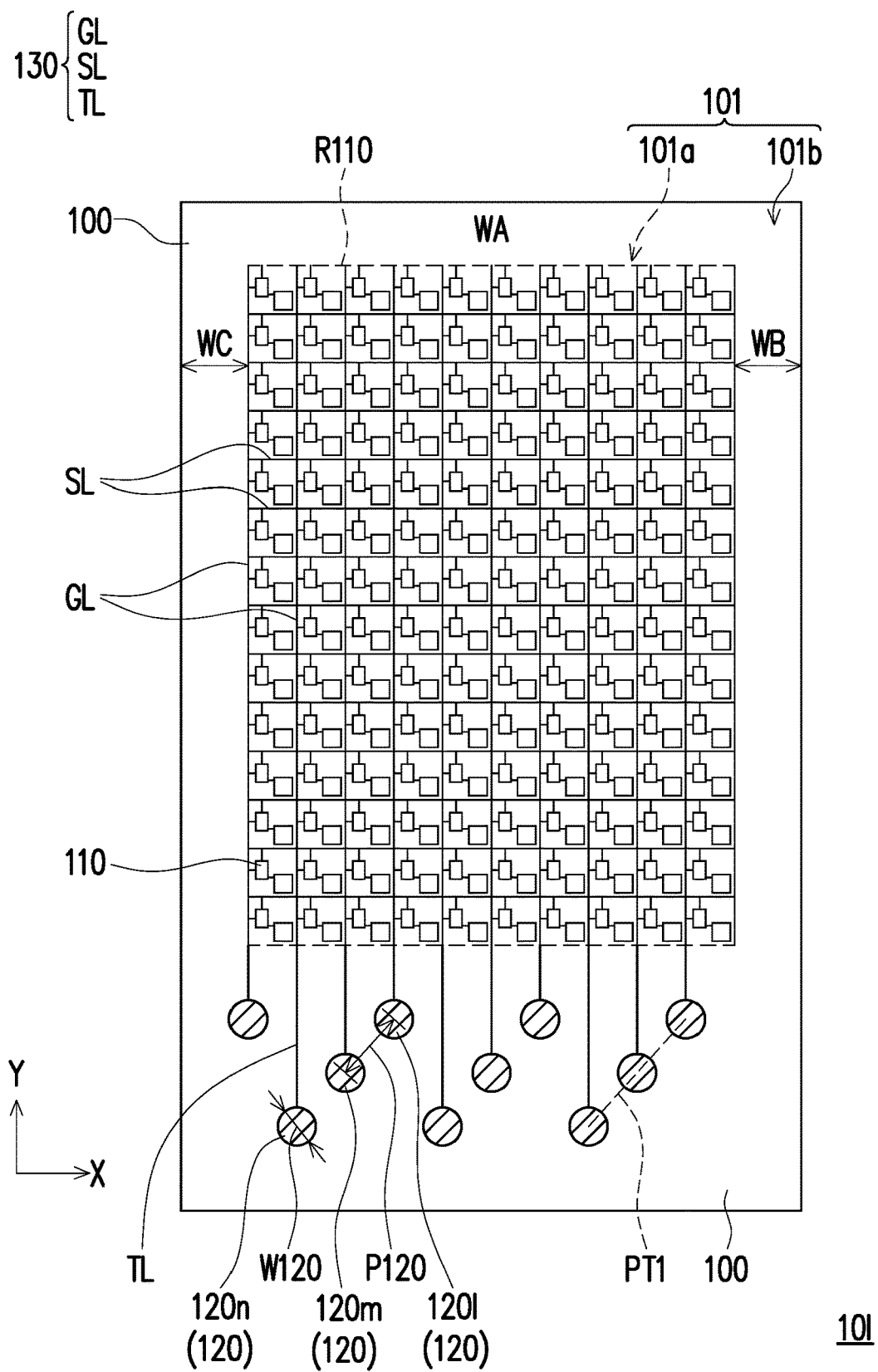
FIG. 9A is a schematic top view of a display panel according to an embodiment of the invention.
Figure 10:
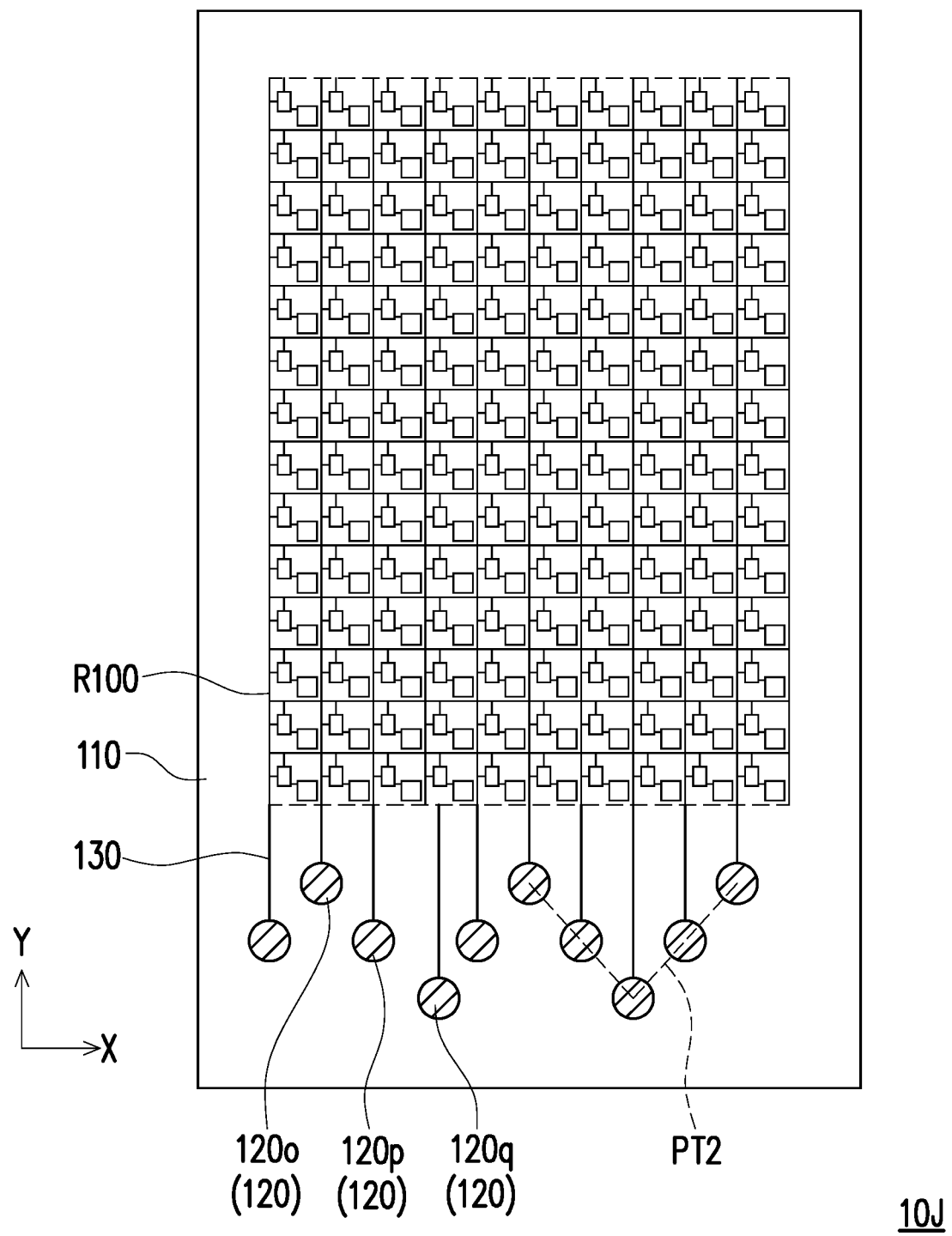
FIG. 10 is a schematic top view of a display panel according to an embodiment of the invention.

FIG. 8, FIG. 9A and FIG. 10 are schematic top views of display panels according to different embodiments. According to FIG. 1A to 1D, the layout of the connection pad 132 herein corresponds to the layout of the conductive connectors 120. Therefore, in FIG. 8, FIG. 9A and FIG. 10, the connection pad 132 is omitted from the illustration, and the conductive connector 120 is directly illustrated to describe various layouts of the conductive connector 120. Specifically, the reference numerals used in FIG. 8, FIG. 9A and FIG. 10 are substantially the same as those in the embodiments of FIG. 1A to FIG. 1D, so the same reference numerals in the embodiments refer to the same or equivalently replaceable elements. In addition, FIG. 8, FIG. 9A and FIG. 10 only illustrate the top view of the display panel, and the display layer and the elements seen in the bottom view are omitted, such as the driving circuit element 140 and the second connection circuit 150. In other words, the display panels of FIG. 8, FIG. 9A and FIG. 10 may include these elements which have been described in the previous embodiments but not illustrated in FIG. 8, FIG. 9A and FIG. 10. In addition, the embodiments of FIG. 8, FIG. 9A and FIG. 10 can also be manufactured with the manufacturing method of FIG. 7A to FIG. 7F.

In FIG. 8, a display panel 10H includes the substrate 100, an active element array R110, a plurality of conductive connectors 120, and a plurality of first connection circuits 130. Although not illustrated in the drawing, the display panel 10H may further include the connection pads 132, the driving circuit elements 140, the second connection circuits 150 and other elements described in the foregoing embodiments. Specifically, the substrate 100 has a first surface 101 and an opposite second surface (e.g., the second surface 102 described in the foregoing embodiments), and the first surface 101 is illustrated in FIG. 8. In the embodiment, the active element array R110 is disposed on the first surface 101 of the substrate 100. The active element array R110 includes a plurality of active elements 110 disposed in an array, and the configuration area of the active element array R110 may be understood as the active area 101a. The conductive connectors 120 each extend from the first surface 101 to the second surface (e.g., the second surface 102 as previously illustrated in FIG. 1A, FIG. 1C, FIG. 2, FIG. 3, etc.) of the substrate 100. The first connection circuits 130 are disposed on the first surface 101 and are each connected between the active element 110 and the conductive connector 120. In the embodiment, the substrate 100 may have the lower edge E1, the right edge E2, an upper edge E3, and a left edge E4. The lower edge E1 and the upper edge E3 are opposite to each other, and the right edge E2 and the left edge E4 are opposite to each other. The conductive connector 120 is located in the peripheral area 101b between the active element array R110 and one edge (e.g., the lower edge E1) of the substrate 100.

Each of the first connection circuits 130 extends from the active area 101a to the peripheral area 101b. For example, the first connection circuit 130 includes source lines SL and gate lines GL located in the active area 101a and traces TL located in the peripheral area 101b. The source lines SL and the gate lines GL intersect with each other and are electrically connected to the active element 110. The gate lines GL each extend in the X direction, for example; and the source lines SL each extend in the Y direction, for example. The traces TL extend from the gate lines GL to the peripheral area 101b and are electrically connected to the conductive connector 120. Meanwhile, since the traces TL are a part of the corresponding first connection circuit 130, the following description of the traces TL can be understood as the description of the first connection circuit 130.

As shown in FIG. 8, the conductive connectors 120 are disposed in multiple rows, e.g., two rows, between the active element array R101 and the lower edge E1 of the substrate 100. For example, for the convenience of description, the traces TL of two adjacent first connection circuits 130 are marked with different reference numerals, such as a trace TLi and a trace TLj. Meanwhile, the conductive connectors 120 corresponding to the traces TLi and TLj are also marked as a conductive connector 120i and a conductive connector 120j. The conductive connectors 120, e.g. the conductive connectors 120i and 120j, connected to the adjacent two first connection circuits 130, e.g. the traces TLi and TLj, may be located in different rows. The conductive connector 120i is relatively close to the active element array R110, and the conductive connector 120j is relatively far from the active element array R120. In other words, at least two of the conductive connectors 120 (e.g., the conductive connector 120i and the conductive connector 120j) are staggered in a direction parallel to the first connection circuit 130. The conductive connector 120i and the conductive connector 120j can be arranged on the extension line of one of the corresponding first connection circuits 130 (e.g., the trace TLi), so the trace TLj can be bent in the extension direction of the corresponding gate line toward the conductive connector 120j. In other embodiments, at least two of the conductive connectors 120 (e.g., the conductive connector 120i and the conductive connector 120j) may be each located on the corresponding two first connection circuits 130, for example, on the extension line of the gate line GL, which is connected to the trace TLi and the trace TLj, but the conductive connector 120i and the conductive connector 120j are staggered in the Y direction.

The conductive connectors 120 are, for example, configured to transmit electrical signals of the gate lines GL, so the number of the conductive connectors 120 may be equal to or greater than the number of the gate lines GL. When the number of the conductive connectors 120 is greater than the number of the gate lines GL, the conductive connectors 120 may be configured to provide signal transmission for other lines. In a layout in which the conductive connectors 120 are disposed in multiple rows (e.g., two rows), the size and the distance of the conductive connectors 120 may be more flexible. For example, in the extension direction of the gate line GL, i.e. the Y direction, a distance P120 between two adjacent conductive connectors 120 may be greater than a distance P110 between two adjacent active elements 110, and in the extension direction of the source line SL, i.e. the X direction, a distance V120 between two adjacent conductive connectors 120 may also be greater than the distance V110 between two adjacent active elements 110. In some embodiments, the distance P120 may be from 100 μm to 400 μm. The distance V120 may be twice the distance P120, but the invention is not limited thereto. In addition, the width W120 of each conductive connector 120 is, for example, 50 μm to 200 μm.

The display panel 10H provides an electrical transmission path penetrating through the substrate 100 by the conductive connectors 120 without configuring the driving circuit elements (e.g., the driving circuit elements 140 described in the previous embodiments) on the first surface 101 of the substrate 100, which contributes to reducing the area of the peripheral area 101b. In addition, in some embodiments, the configuration position of the conductive connector 120 approximately corresponds to the width WA of the active element array R110. The configuration position of the conductive connector 120 does not significantly exceed the width WA of the active element array R110 in the X direction. That is, the width of the configuration position of the conductive connector 120 in the X direction is less than or equal to the width WA of the active element array R110. In this way, the width WB of the peripheral area 101b between the active element array R110 and the right edge E2 in the X direction and the width WC of the peripheral area 101b between the active element array R110 and the left edge E4 in the X direction can be kept to a minimum. Therefore, the display panel 10H may have a slim boarder.

A display panel 10I of FIG. 9A is substantially similar to the display panel 10H of FIG. 8, so the same reference numerals in the two embodiments may refer to the same or equivalently replaceable elements. Specifically, the display panel 10I includes the substrate 100, the active element array R110 disposed on the first surface 101 of the substrate 100, a plurality of conductive connectors 120, and a plurality of first connection circuits 130. Similar to the embodiment of FIG. 8, the connection pads 132, the driving circuit elements 140, the second connection circuits 150, and other elements illustrated in FIG. 1A to FIG. 1D are omitted in the display panel 10I of FIG. 9A, and the embodiment may be manufactured by the manufacturing method of FIG. 7A to FIG. 7D. In addition, the display panel 10I may implement the conductive connector 120 and the first connection circuit 130 in the manner illustrated in FIG. 2 or FIG. 3. Specifically, the display panel 10I illustrates another layout of the conductive connectors 120, so for other elements of the display panel 10I, refer to the foregoing embodiments.

In the display panel 10I, the conductive connectors 120 are arranged in three rows between the active element array R110 and the lower edge E1 of the substrate 100. The active element array R110 includes a plurality of active elements 110 disposed in an array in the active area 101a. The first connection circuit 130 may include gate lines GL, source lines SL, and traces TL. The gate lines GL and the source lines SL are staggered and electrically connected to the corresponding active elements 110, and the traces TL each extend from the corresponding gate lines GL beyond the active area 101a to the peripheral area 101b to be connected to the conductive connectors 120. In FIG. 9A, for the convenience of description, three consecutive conductive connectors 120 are marked as conductive connectors 120l, 120m and 120n. The conductive connector 120l, the conductive connector 120m, and the conductive connector 120n are staggered in a direction parallel to the first connection circuit 130 (e.g., the gate line GL). In other words, the conductive connector 120l, the conductive connector 120m and the conductive connector 120n are located in different rows, for example. For example, the conductive connector 120l is closer to the active element array R110 than the conductive connector 120m, and the conductive connector 120m is closer to the active element array R110 than the conductive connector 120n. In addition, the extension lengths of the three consecutive traces TL corresponding to the conductive connector 120l, the conductive connector 120m, and the conductive connector 120n in the peripheral area 101b are different. In this way, the distance P120 between two adjacent conductive connectors 120 can be appropriately increased, for example, from 100 μm to 400 μm, so as to prevent the problem of short circuit or difficult manufacturing resulting from two adjacent conductive connectors 120 being too close to each other. In addition, the respective widths W120 of the conductive connectors 120 may also be appropriately increased, for example, from 50 μm to 200 μm, so as to maintain the stability and electrical transmission characteristics of the conductive connectors 120.

In FIG. 9A, the conductive connectors 120 are arranged in three rows. A row closest to the active element array R110, i.e. the row of the conductive connector 120l, is disposed in a manner in which one conductive connector 120 is disposed at an interval of every two first connection circuits 130. The row located in the middle, i.e. the row of the conductive connectors 120m, is disposed in a manner in which one conductive connector 120 is disposed at an interval of every two first connection circuits 130. A row farthest from the active element array R110, i.e. the row of the conductive connector 120n, is disposed in a manner in which one conductive connector 120 is disposed at an interval of every two first connection circuits 130. Therefore, the conductive connectors 120 in the three rows are disposed at approximately the same distance to form a slanting path PT1 resembling a slash "l", but the invention is not limited thereto.

Figure 9B:
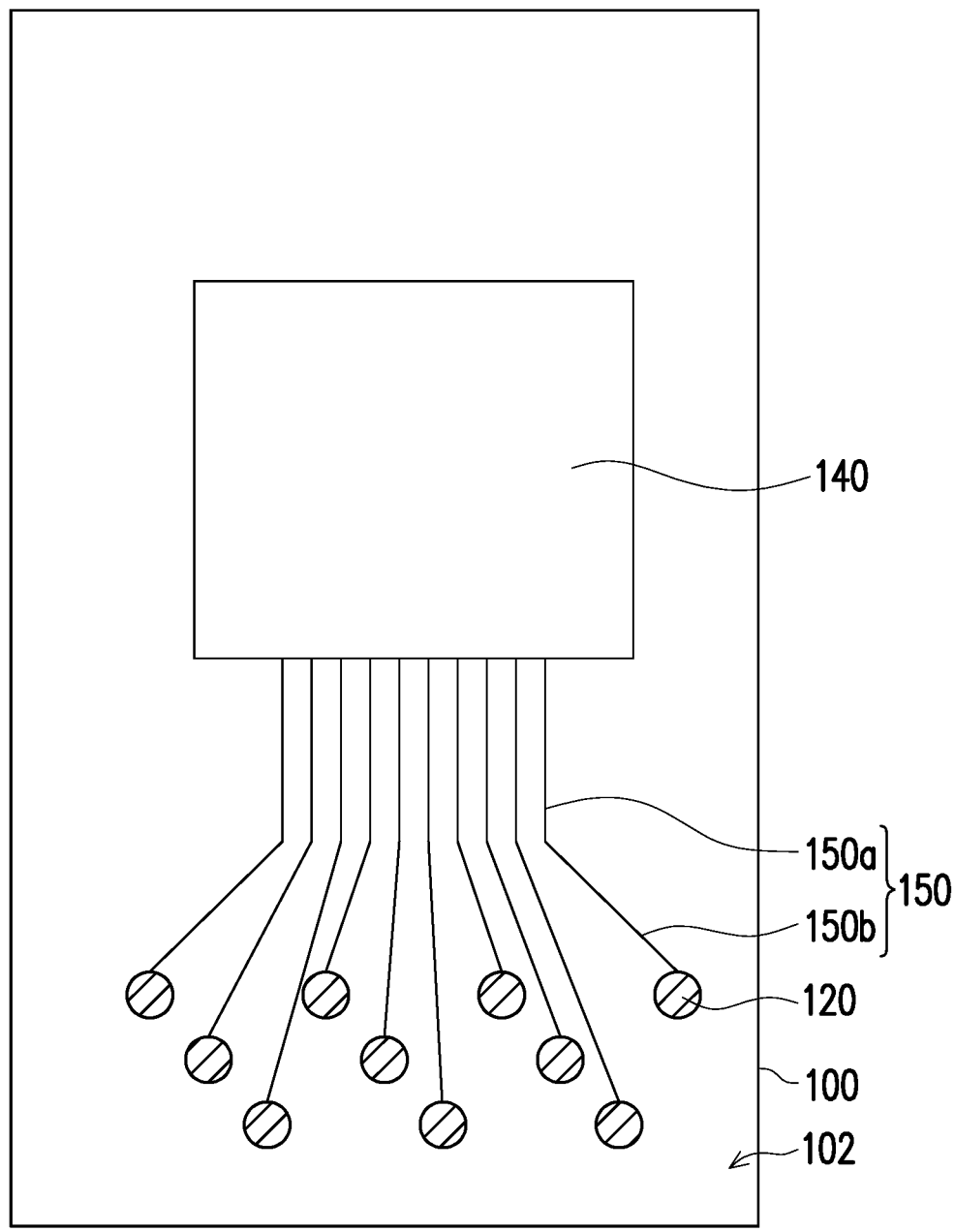
FIG. 9B is a schematic bottom view of a display panel according to an embodiment of the invention.

In addition, FIG. 9B is a schematic bottom view of the display panel 10I. In FIG. 9B, the display panel 10I includes the substrate 100, the driving circuit element 140, and the second connection circuit 150. Specifically, FIG. 9B illustrates the second surface 102 of the substrate 100 and the driving circuit element 140 and the second connection circuits 150 disposed on the second surface 102. Additionally, the conductive connectors 120 also extend to the second surface 102 as shown in FIG. 9B. The second connection circuit 150 is connected between the driving circuit element 140 and the conductive connector 120. According to FIG. 9B, some of the conductive connectors 120 are relatively close to the driving circuit element 140, so that the corresponding second connection circuits 150 are shorter. Such a design contributes to the length reduction of the second connection circuit 150. The difference between the design of the second connection circuit 150 and that of FIG. 1C is that the second connection circuit 150 is connected between the driving circuit element 140 and the conductive connector 120 in a multi-line manner. For example, the second connection circuit 150 is formed by connecting a line segment 150a and a line segment 150b.

A display panel 10J of FIG. 10 is substantially similar to the display panel 10I of FIG. 9A, and FIG. 10 is used to illustrate another layout design of the conductive connector 120. Accordingly, elements marked with the same reference numerals in the two embodiments may refer to each other. In FIG. 10, the conductive connectors 120 are arranged in three columns. For convenience of description, three consecutive conductive connectors 120 are marked as a conductive connector 120o, a conductive connector 120p, and a conductive connector 120q. A row closest to the active element array R110, i.e. the row of the conductive connector 120o, is disposed in a manner in which one conductive connector 120 is disposed at an interval of every two first connection circuits 130. The row located in the middle, i.e. the row of the conductive connectors 120p, is disposed in a manner in which one conductive connector 120 is disposed at an interval of one first connection circuit 130. A row farthest from the active element array R110, i.e. the row of the conductive connector 120q, is disposed in a manner in which one conductive connector 120 is disposed at an interval of every two first connection circuits 130. Therefore, the conductive connectors 120 in three rows are disposed at different distances to form the V-shaped path PT2, but the invention is not limited thereto.

In summary, in the display panel and the manufacturing method of the invention, the conductive connector penetrating through the substrate is formed, so that the driving circuit element and the active element may be respectively disposed on the opposite surfaces of the substrate, and are electrically connected to the corresponding circuit through the conductive connector, thereby reducing a space occupied by the driving circuit element in a bezel of the display panel, and achieving an extremely slim bezel or nearly no bezel effect. The conductive connectors may be arranged in multiple rows to reduce the width of the area required for configurating the conductive connectors, so the design of the display panel can retain a slime bezel.

What is claimed is:

1. A display panel, comprising: a substrate, having a first surface and a second surface opposite to the first surface; an active element, disposed on the first surface; a driving circuit element, disposed on the second surface; a first connection circuit, disposed on the first surface, and connected to the active element; a second connection circuit, disposed on the second surface, and connected to the driving circuit element; and a conductive connector, penetrating through the substrate, and two ends of the conductive connector electrically connected to the first connection circuit and the second connection circuit, respectively; and the active elements are disposed in an array to define an active area, and the conductive connector is located in a peripheral area between the active area and at least one edge of the substrate; and the first connection circuit extends from the active area to the peripheral area; and the first connection circuit comprises: a connection pad, disposed on the first surface and covering the conductive connector, wherein a projection area of the connection pad on the first surface is greater than an end surface area of the conductive connector on the first and second surfaces; and a minimum width of the conductive connector is smaller than a width of the end surface area of the conductive connector on the first and second surfaces and gradually increased toward the first and second surfaces.

2. The display panel as claimed in claim 1, wherein the active elements are disposed in an array to define an active area, and the conductive connector is located in the active area.

3. The display panel as claimed in claim 1, wherein an end surface area of the conductive connector on the first surface is less than an end surface area of the conductive connector on the second surface.

4. The display panel as claimed in claim 1, further comprising a display layer disposed on the first surface, and the active element is adapted to drive the display layer.

5. The display panel as claimed in claim 1, wherein a number of the conductive connectors is plural and the conductive connectors are arranged in multiple rows between an active element array formed by the active elements and one edge of the substrate.

6. The display panel as claimed in claim 5, wherein a distance between two adjacent conductive connectors is from 100 μm to 400 μm.

7. The display panel as claimed in claim 5, wherein a distance between two adjacent conductive connectors is greater than a distance between two adjacent active elements.

8. The display panel as claimed in claim 1, wherein a width of each conductive connector is from 50 μm to 200 μm.

9. The display panel as claimed in claim 1, wherein a number of the conductive connectors is plural, a number of the first connection circuits is plural, and the conductive connections connected to the two adjacent first connection circuits are located in different rows.

10. The display panel as claimed in claim 1, wherein a width of a configuration position of the conductive connector in an X direction is less than or equal to a width of an active element array formed by the active elements.

11. The display panel as claimed in claim 1, wherein a number of the conductive connectors is plural, and at least two of the conductive connectors are staggered in a direction parallel to the first connection circuit.

12. The display panel as claimed in claim 1, wherein the second connection circuit is connected between the driving circuit element and the conductive connector in a multi-line manner.

13. A manufacturing method of a display panel, comprising: providing a substrate, wherein the substrate has a first surface and a second surface opposite to the first surface; forming a through hole penetrating through the substrate; filling a conductive material into the through hole to form a conductive connector; forming an active element on the first surface; forming a first connection circuit on the first surface to be connected to the active element and the conductive connector; forming a second connection circuit on the second surface to be connected to the conductive connector; and disposing a driving circuit element on the second surface to be connected to the second connection circuit; and forming the active elements in an array to define an active area, and the conductive connector is located in a peripheral area between the active area and at least one edge of the substrate; and the first connection circuit extends from the active area to the peripheral area; and forming the first connection circuit with a connection pad, disposed on the first surface and covering the conductive connector, wherein a projection area of the connection pad on the first surface is greater than an end surface area of the conductive connector on the first and second surfaces; and a minimum width of the conductive connector is smaller than a width of the end surface area of the conductive connector on the first and second surfaces and gradually increased toward the first and second surfaces.

14. The manufacturing method of the display panel as claimed in claim 13, wherein the step of forming the first connection circuit on the first surface comprises:
forming a connection pad on the first surface to cover the conductive connector, wherein a projection area of the connection pad on the first surface is greater than a projection area of the conductive connector on the first surface.

15. The manufacturing method of the display panel as claimed in claim 13, wherein the step of forming the through hole penetrating through the substrate comprises performing laser drilling from the first surface or/and the second surface.

16. The manufacturing method of the display panel as claimed in claim 13, wherein the step of filling the conductive material into the through hole comprises an electroplating method or a vacuum screen printing method.

* * * * *